United States Patent [19]

McLeod

[11] Patent Number: 5,736,878
[45] Date of Patent: Apr. 7, 1998

[54] LOW COST, HIGH SPEED TRACK AND HOLD CIRCUIT

[75] Inventor: Scott Cameron McLeod, Oro Valley, Ariz.

[73] Assignee: Delco Electronics Corporaiton, Kokomo, Ind.

[21] Appl. No.: 667,557

[22] Filed: Jun. 21, 1996

[51] Int. Cl.$^6$ ................................................. G11C 27/02
[52] U.S. Cl. ................................................. 327/94; 327/96
[58] Field of Search ................................. 327/91, 93, 94, 327/95, 96, 97, 52, 63, 432, 405, 560–563

[56] References Cited

U.S. PATENT DOCUMENTS

| | | | |
|---|---|---|---|
| 4,982,119 | 1/1991 | Tateishi | 327/96 |
| 5,039,880 | 8/1991 | Astegher et al. | 327/96 |
| 5,047,666 | 9/1991 | Astegher et al. | 327/94 |
| 5,081,423 | 1/1992 | Koyama et al. | 327/94 |
| 5,148,162 | 9/1992 | Crosby | 327/96 |
| 5,298,801 | 3/1994 | Vorenkamp et al. | 327/91 |
| 5,510,736 | 4/1996 | Van De Plassche | 327/96 |

*Primary Examiner*—Toan Tran
*Assistant Examiner*—My-Trang Nu Ton
*Attorney, Agent, or Firm*—Mark A. Navarre

[57] ABSTRACT

A very fast circuit for tracking an input signal and holding the value for digitization comprises a holding capacitor, two charging circuits connected to either side of the capacitor and extending between a constant current generator and a supply voltage. Each charging circuit has an input transistor responsive to an analog input signal and a load including the capacitor, as well as a series switching transistor responsive to a sample signal to permit a tracking mode or forcing a hold mode. The load includes a diode to effect a low resistance during the tracking mode when the capacitor is charging and a very high resistance during the hold mode when the capacitor is discharging.

5 Claims, 1 Drawing Sheet

LOW COST, HIGH SPEED TRACK AND HOLD CIRCUIT

FIELD OF THE INVENTION

This invention relates to a track and hold circuit and particularly to such a circuit which is fast.

BACKGROUND OF THE INVENTION

In signal processing it is a practice to digitize analog signals for digital processing. This is accomplished by first sampling the analog signal at prescribed points in time and then converting each analog sample to digital form. A common form of track and hold circuit used for the sampling comprises a FET for coupling a signal voltage to a holding capacitor which tracks the voltage, and a sample voltage applied to switch off the FET to hold the capacitor voltage for a period sufficient for the digitization. The capacitor voltage is buffered by an operational amplifier to provide a low impedance output drive which is coupled to an analog-to-digital converter.

The FET track and hold circuit however is slow and thus not suitable for high frequency applications, and further it causes large switching transients at the output when the switching occurs.

SUMMARY OF THE INVENTION

It is therefore an object of the invention to perform track and hold operations at high speed and without large switching transients. Another object is to perform the track and hold operations by a simple, low cost circuit.

A pair of charging circuits are coupled to opposite sides of a holding capacitor and respond to an analog input signal to impose a voltage on the capacitor which tracks the input signal, preferably with a gain greater than unity. A constant current source supplies both charging circuits, and each circuit has an impedance path containing a diode to afford low impedance during tracking and high impedance during hold. An input transistor in each charging circuit is controlled by the input signal to carry out the tracking. A first transistor switch in each charging circuit conducts to enable the tracking function and turns off to hold the capacitor voltage. A second transistor switch associated with each input transistor and in series with the constant current source is turned on when the first transistor is off to provide a path for the constant current.

BRIEF DESCRIPTION OF THE DRAWINGS

The above and other advantages of the invention will become more apparent from the following description taken in conjunction with the accompanying drawings wherein like references refer to like parts and wherein.

DESCRIPTION OF THE INVENTION

The ensuing description is directed to a track and hold circuit developed for high speed use such as processing signals on the order of 75 MHz at sampling rates of 5 MHz. It will be apparent, however, that the circuit is useful for a broad variety of applications where a low cost and simple circuit is desirable.

Figure 1:
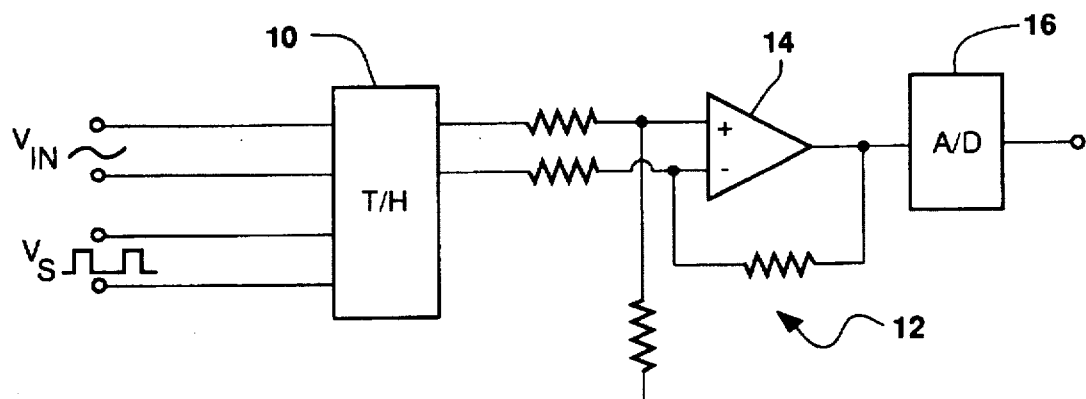
FIG. 1 is a block diagram of a circuit utilizing a track and hold circuit.

FIG. 1 illustrates the environment of a track and hold circuit 10 having an analog input signal $V_{IN}$ and a square wave sampling signal $V_S$ which may have a low duty cycle "on" time. The differential output of the track and hold circuit 10 is coupled to a buffer 12 including an operational amplifier 14 and associated input and feedback resistors. The single-ended buffer output is equal to or proportional to the value of the input signal $V_{IN}$ at the instant the sampling signal $V_S$ switched to its off cycle. The buffer 12 output is fed to an analog-to-digital converter 16 which yields a digitized value corresponding to the buffer output. The input signal $V_{IN}$ may be single-ended as well; then the signal $V_{IN}$ on one line is referenced to a reference voltage and the second input line is fixed at the reference voltage.

Figure 2:
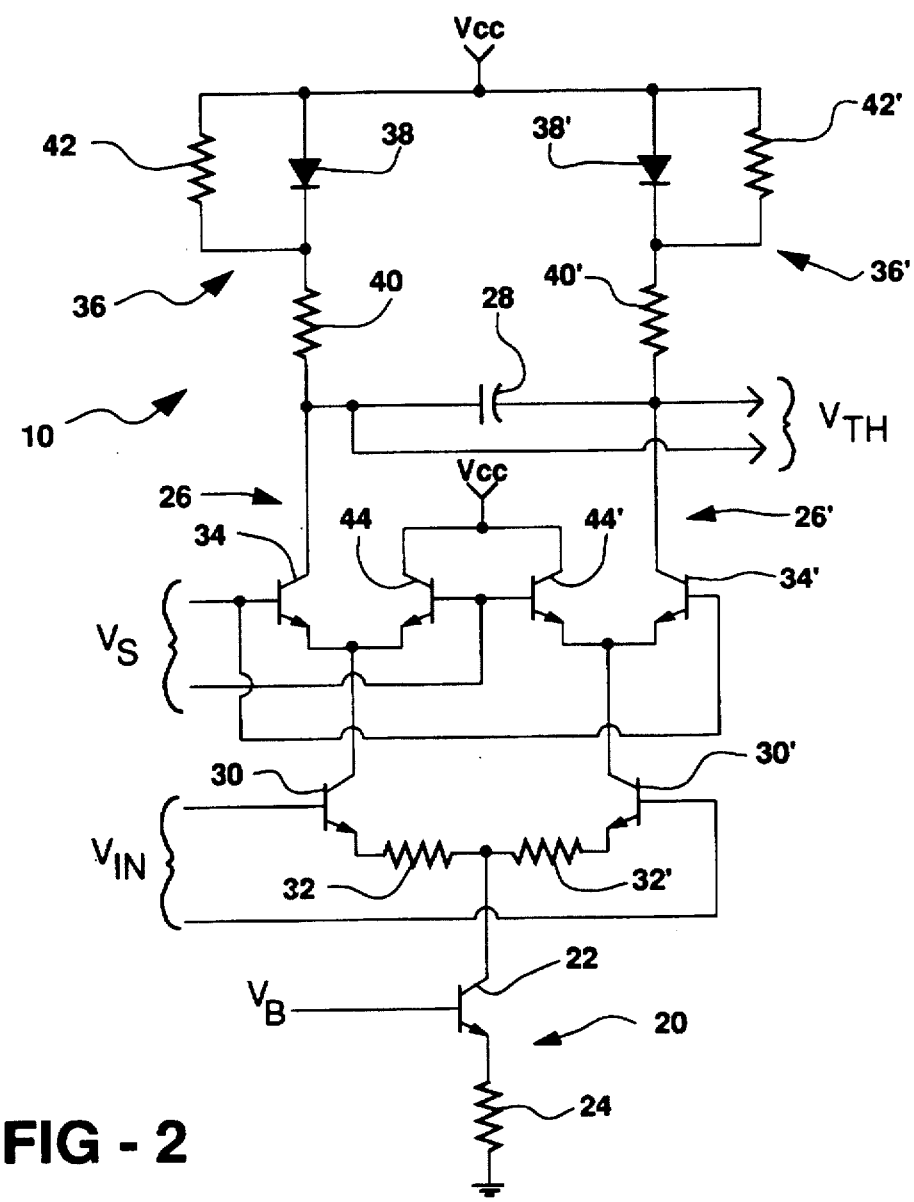
FIG. 2 is a schematic circuit of a track and hold circuit according to the invention.

Referring to FIG. 2, all the active components of the track and hold circuit 10 are bi-polar transistors (including two transistors configured as diodes) so that the circuit lends itself to a simple monolithic implementation. The circuit includes a constant current generator 20 comprising a transistor 22 coupled through a resistor 24 to ground, the transistor base being coupled to a bias voltage $V_B$. A pair of charging circuits 26 and 26' extend from the constant current generator 20 to a supply voltage $V_{CC}$ and are connected to opposite sides of a holding capacitor 28. The charging circuits are symmetrical; one circuit will be described and the other circuit will have identical corresponding components marked with a prime. The transistors are NPN type and include an input transistor 30 having its emitter connected through a resistor 32 to the constant current generator 20. The collector of the input transistor 30 is coupled through a first switch or sample transistor 34 to one side of the capacitor 28 and through an impedance circuit 36 to the supply voltage $V_{CC}$. The impedance circuit includes a diode 38 having its anode connected to the supply voltage and its cathode connected through a small resistor 40 to capacitor 28. A large resistor 42 is connected across the diode 38. A second switch or bypass transistor 44 has its emitter coupled to the emitter of the sample transistor 34, and its collector is connected to the supply voltage $V_{CC}$. The base of bypass transistor 44 is connected to one side of the sample signal $V_S$ and the base of the sample transistor 34 is connected to the other side of the sample signal so that the switches 34 and 44 conduct in opposed phase. The track and hold output voltage $V_{TH}$ appears across the holding capacitor 28.

In operation, when the base of the sample transistors 34, 34' is at a potential at least 100 mv greater than the potential of the bypass transistors 44, 44', transistors 44, 44' are off and all the current through the constant current generator 20 is routed through the charging circuits 26, 26' to the load formed by impedance circuits 36, 36' and the capacitor 28. Then the diodes 38, 38' are biased on and have a very low impedance, and the circuit output (across the capacitor 28) tracks the input with a gain determined by the resistor ratio of (resistor 40)/(resistor 32).

When the biasing on the sample and bypass transistors 34 and 44 is reversed, all the current through the constant current generator is routed through the bypass transistors 44, 44' to $V_{CC}$. The collectors of transistors 34, 34' are essentially open circuits so that the charge built up across holding capacitor during the tracking time must now discharge through the impedance circuits 36, 36'. The diodes, 38, 38' are in very high impedance state, but there is a small leakage current through the sampling transistors 34, 34'. To prevent that current from turning on the diodes 38, 38', the resistors 42, 42' pass the current by the diodes; the resistor values are chosen to be as high as possible without generating a voltage drop sufficient to allow the diodes to turn on (approximately >0.3 volt). Thus when in the track mode the capacitor is charged with the input signal through resistors 40, 40', whereas in the hold mode there is no charging by the input signal and the capacitor very slowly discharges through resistors 40, 42, 40' and 42'. With the value of resistors 42, 42' much greater than resistors 40, 40' the circuit performs as a high speed track and hold. As an example of component values, the holding capacitor may be about 100 pf, the resistors 40, 40', 32 and 32, are less than 100 ohms, and the resistors 42, 42' are about 7 kohms.

It will thus be seen that the track and hold circuit is simple, inexpensive to implement on a chip, and operable at high speed.

The embodiments of the invention in which an exclusive property or privilege is claimed are defined as follows:

1. A track and hold circuit comprising:

a holding capacitor;

a constant current source;

a pair of parallel charging circuits connected to opposite sides of the capacitor for charging the capacitor through the constant current source;

each charging circuit having an input transistor including a base which comprises an input for an analog signal;

each charging circuit having an impedance path connected from the capacitor to one side of a power supply; and switch means for alternately enabling and disabling charging through the input transistors, including a sampling transistor in series with each input transistor and controlled to on and off states by a sample control signal, and a bypass transistor in series with each input transistor and controlled by the sample control signal to on and off states opposite the states of the sampling transistor to provide an alternate current path through the input transistors and the constant current source when the sampling transistors are off;

whereby the capacitor tracks the analog signal when charging is enabled and holds a signal value present when the charging is disabled.

2. The track and hold circuit as defined in claim 1 wherein each impedance path includes a diode for low impedance charging when the switch means enables charging and for high impedance discharging when the switch means disables charging.

3. The track and hold circuit as defined in claim 1 wherein the charging circuits amplify the analog signal.

4. The track and hold circuit as defined in claim 1 wherein the charging circuits are connected through a common resistive path to the other side of the power supply.

5. A track and hold circuit comprising:

a constant current source connected to one side of a power supply;

a holding capacitor;

a pair of parallel charging circuits connected between the constant current source and opposite sides of the capacitor for charging the capacitor;

each charging circuit having an input transistor and a sampling transistor coupled in series;

the input transistors having bases coupled to an analog input signal;

the sampling transistors being controlled by a sample control signal for alternately enabling and disabling charging through the input transistors; and each charging circuit having an impedance path between a respective side of the capacitor and the other side of the power supply, including a diode for completing a low impedance path to said power supply for charging the capacitor to a voltage in proportion to the analog input signal when the switch means is enabling charging, and a relatively high impedance resistor connected in parallel with said diode for completing a relatively high impedance path through which the capacitor discharges when the switch means is disabling charging, thereby to hold the capacitor voltage substantially at a value when charging is disabled.

* * * * *